United States Patent
Qu et al.

(10) Patent No.: US 11,239,133 B2
(45) Date of Patent: *Feb. 1, 2022

(54) APPARATUS AND METHOD FOR DISSIPATING HEAT IN MULTIPLE SEMICONDUCTOR DEVICE MODULES

(71) Applicant: Micron Technology, Inc., Boise, ID (US)

(72) Inventors: Xiaopeng Qu, Boise, ID (US); Shams U. Arifeen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/234,079

(22) Filed: Apr. 19, 2021

(65) Prior Publication Data
US 2021/0272870 A1 Sep. 2, 2021

Related U.S. Application Data

(63) Continuation of application No. 16/803,637, filed on Feb. 27, 2020, now Pat. No. 11,011,449.

(51) Int. Cl.
*G11C 16/04* (2006.01)
*H01L 23/367* (2006.01)
(Continued)

(52) U.S. Cl.
CPC .......... *H01L 23/3672* (2013.01); *G11C 5/025* (2013.01); *G11C 11/34* (2013.01); *H01L 23/427* (2013.01)

(58) Field of Classification Search
CPC ..... G11C 5/025; G11C 11/34; H01L 23/3672; H01L 23/427
See application file for complete search history.

(56) References Cited

U.S. PATENT DOCUMENTS 6,922,338 B2* 7/2005 Poechmueller ........ G11C 5/005
165/80.3
7,473,993 B2* 1/2009 Baek ..................... H01L 21/563
257/678
(Continued)

FOREIGN PATENT DOCUMENTS

CN 201609005 U 10/2010
CN 109727937 A 5/2019
(Continued)

OTHER PUBLICATIONS

Cofan USA, retrieved online on Feb. 27, 2020 from url https://www.cofan-usa.com/vapor-chambers/; copyright 2020, 4 pages.
(Continued)

*Primary Examiner* — Pho M Luu
(74) *Attorney, Agent, or Firm* — Perkins Coie LLP

(57) ABSTRACT

A semiconductor memory system having a plurality of semiconductor memory modules that are spaced apart from each other by a gap. The system includes a heat dissipation assembly having a thermally conductive base portion configured to transfer heat away from the memory devices. The heat dissipation assembly including at least one cooling unit extending from the base portion. The at least one cooling unit having a wall with an exterior surface and a cavity. The cooling unit is configured to fit in the gap between adjacent memory modules such that a portion of the exterior surface on a first side of the cooling unit is coupled to one of the first memory devices and another portion of the exterior surface on a second side of the cooling unit is coupled to one of the second memory devices across the gap.

20 Claims, 5 Drawing Sheets

(51) Int. Cl.
*G11C 5/02* (2006.01)
*G11C 11/34* (2006.01)
*H01L 23/427* (2006.01)

(56) References Cited

U.S. PATENT DOCUMENTS

| | | | |
|---|---|---|---|
| 7,755,897 B2* | 7/2010 | Chen | H01L 23/427 |
| | | | 361/707 |
| 7,791,881 B2* | 9/2010 | Chou | H01L 23/40 |
| | | | 361/695 |
| 9,337,119 B2 | 5/2016 | Vadhavkar et al. | |
| 9,443,744 B2 | 9/2016 | Vadhavkar et al. | |
| 9,691,746 B2 | 6/2017 | Vadhavkar et al. | |
| 11,011,449 B1* | 5/2021 | Qu | H01L 23/427 |
| 2006/0221573 A1 | 10/2006 | Li | |
| 2014/0340849 A1 | 11/2014 | Kim | |
| 2019/0132995 A1 | 5/2019 | Qu | |

FOREIGN PATENT DOCUMENTS

| | | |
|---|---|---|
| JP | 2012033567 A | 2/2012 |
| JP | 2013520812 A | 6/2013 |
| JP | 2017520932 A | 7/2017 |
| JP | 2017520933 A | 7/2017 |
| JP | 2017525150 A | 8/2017 |

OTHER PUBLICATIONS

Techquickie; https://www.youtube.com/watch?v=M4POFT3Ctek, Mar. 30, 2014, 2 pages.

"Heat Pipe Resources", Advanced Cooling Technologies, Inc.; retrieved online on Feb. 27, 2020 from url: https://www.1-act.com/resources/heat-pipe-resources/; copyright 2020, 12 pages.

"Vapor Chamber", celsia Inc.; retrieved online on Feb. 27, 2020 from url: https://celsiainc.com/technology/vapor-chamber/; copyright 2004-2020, 11 pages.

Office Action dated Dec. 3, 2021 for Chinese Patent Application No. 202110203048.2, 7 pages.

* cited by examiner

APPARATUS AND METHOD FOR DISSIPATING HEAT IN MULTIPLE SEMICONDUCTOR DEVICE MODULES

CROSS-REFERENCE TO RELATED APPLICATION(S)

This application is a continuation of U.S. application Ser. No. 16/803,637, filed Feb. 27, 2020, now U.S. Pat. No. 11,011,449; which is incorporated herein by reference in its entirety.

TECHNICAL FIELD

The present disclosure generally relates to semiconductor devices, and more particularly to apparatuses and methods for dissipating heat in multiple semiconductor device modules.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of memory cells in a memory device. Various types of memory devices exist, including magnetic hard disks, random access memory (RAM), read only memory (ROM), dynamic RAM (DRAM), synchronous dynamic RAM (SDRAM), and others.

Improving memory packages, generally, may include increasing memory cell density, reducing operational latency (e.g. increasing read/write speeds), increasing reliability, increasing data retention, reducing power consumption, reducing manufacturing costs, and reducing the size or footprint of the memory packages and/or components of the memory devices, among other metrics. A challenge associated with improving memory packages is that increasing memory device density and increasing the speed or processing ability of the memory devices generates more heat. Without sufficient cooling, the additional heat can cause the memory devices to exceed their maximum operating temperatures ($T_{max}$).

DETAILED DESCRIPTION

Specific details of several embodiments of memory modules having heat dissipating assemblies, and associated systems and methods, are described below with reference to the appended figures. In several of the embodiments, a memory system can include multiple memory modules, such as dual in-line memory modules (DIMMs), each having a substrate and a plurality of memory devices electrically coupled to the substrate. The memory devices can include first and second memory devices on a front side and a back side of the substrate, respectively. The heat dissipation assemblies are configured to enhance cooling of the memory devices. The heat dissipation assembly can include a thermally conductive body having a base portion and a plurality of heat dissipating components. The base portion can be configured to transfer heat to a surrounding environment via at least one of conduction or convection. The thermally conductive body can have at least one cooling unit extending from the base portion such as, for example, a passive cooling unit. The cooling unit can include a wall defining a cavity configured to contain a cooling component. Each wall, for example, can have a U-shape that defines an enclosed cavity, or the wall can have open cavities that receive one or more cooling components. The cooling unit can be configured to fit in the gap between adjacent memory modules such that the exterior surface on one side of the cooling unit is adjacent one semiconductor memory device and the exterior surface on the other side of the cooling unit is adjacent the other semiconductor memory device. The heat dissipation assembly can be configured such that the gap between each pair of memory modules is occupied by a cooling unit. The cooling component can be a phase transition component disposed in the cavity of the cooling unit, and the phase transition component can be configured to transfer heat from the interior of the cooling unit to the base portion.

Figure 4:
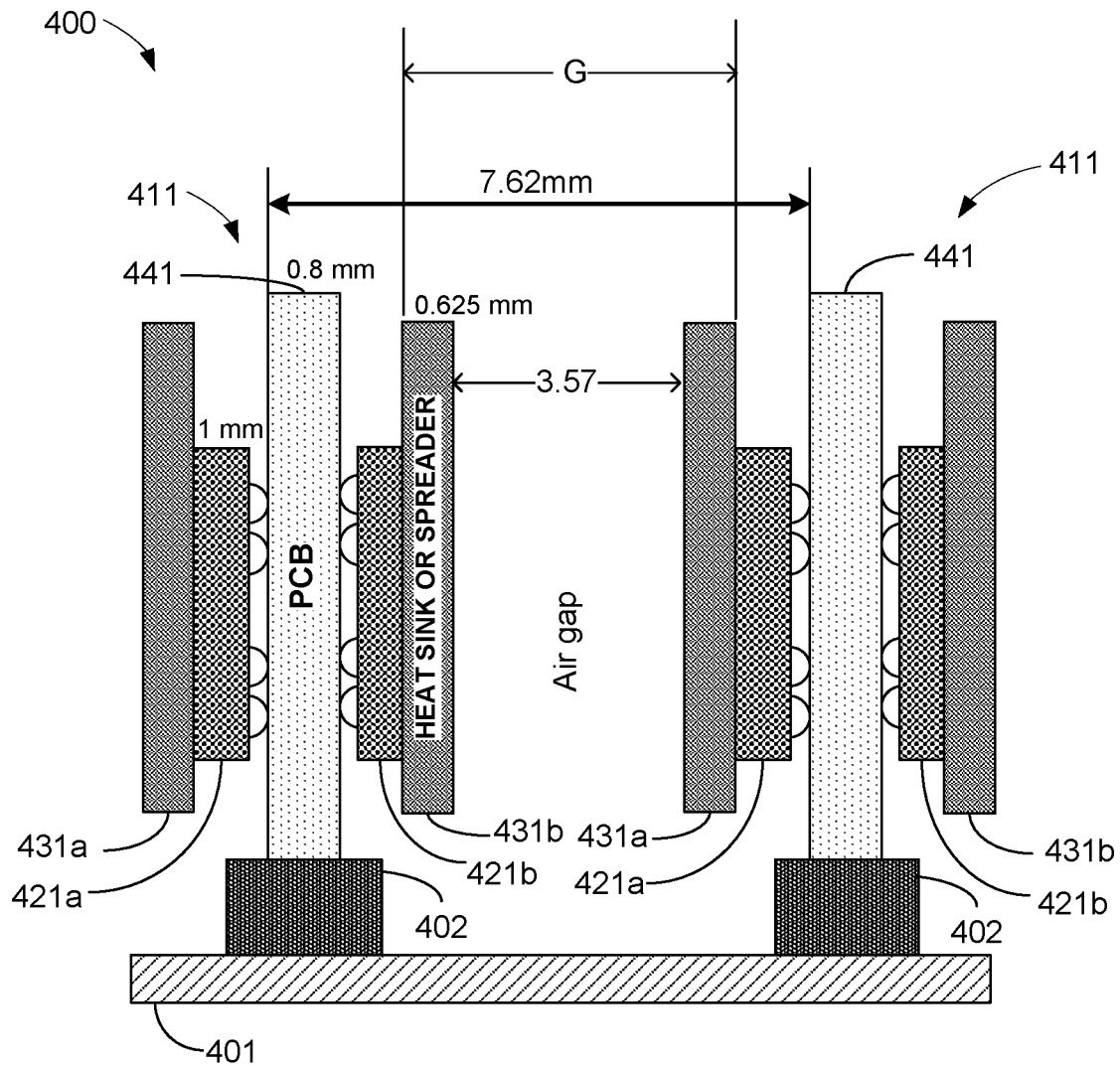
FIG. 4 illustrates an exemplary heat sink for memory modules.

FIG. 4 illustrates a memory system 400 including multiple memory modules. The memory system 400 can include a computing device 401 (e.g., a motherboard) and memory modules 411 connected to the computing device 401 by memory connectors 402. The memory modules 411 can each include multiple semiconductor memory devices (e.g., memory dies), such as memory devices 421a,b on either side of a printed circuit board (PCB) 441. In operation, memory devices 421a,b generate heat, which can negatively impact the operation of memory system 400. Accordingly, the memory system 400 can include heat sinks (e.g., fin-type heat sinks) or heat spreaders (e.g., vacuum chamber heat spreaders or heat pipes), such as heat sinks or spreaders 431a and 431b attached to opposing sides of the memory modules 411. The heat sinks typically have fins or other features that increase the surface area for enhancing heat dissipation, and an airflow generated by a fan can be used to further dissipate heat from the memory devices. Heat spreaders typically have a large, flat external surface area and typically do not have fans or fins. Instead, the heat spreader directly contacts the memory device to dissipate heat.

In a DDR5 memory system, the memory modules 411 may be spaced apart by a predetermined pitch (e.g., of about 7.62 mm). The space available between adjacent memory modules 411 for the heat sinks or spreaders 431a,b is about equal to this pitch minus the thickness of one of the memory modules (e.g., about 2.8 mm). Thus, the gap G between opposing memory devices available for the two heat sinks or spreaders 431a,b is about 4.82 mm. In some systems, each of the heat sinks or spreaders 431a,b can be about 0.625 mm thick. Accordingly, in such systems, an air gap of about 3.57 mm remains between the adjacent heat sinks or spreaders for air to flow for cooling. This is generally enough space for airflow to adequately dissipate heat from the memory devices 421a,b for such heat sinks or spreaders. However, for many electronic devices it is desirable for the pitch between the PCBs 441 of the memory modules 411 to be as small as possible while still keeping the memory devices 421a,b below the maximum operating temperature ($T_{max}$).

This generally requires that the gap G between opposing memory devices of adjacent memory modules be greater than about 2 mm so that there is a sufficient gap for airflow to adequately dissipate the heat generated by the memory modules 411.

To address the foregoing problems, the present technology is directed to heat dissipation assemblies for semiconductor device modules or other electronic devices that enable small gap widths between adjacent high-performance electronic components. For example, several embodiments of present technology are expected to adequately dissipate heat generated by adjacent memory modules with reduced spacing (e.g., 250 microns or less) between the memory modules. For purposes of clarity, exemplary embodiments of the present technology are described with respect to memory modules in a memory system, but the present technology can also be implemented with other types of systems with limited spacing between semiconductor devices and other electronic components.

Figures 1A, 1B:
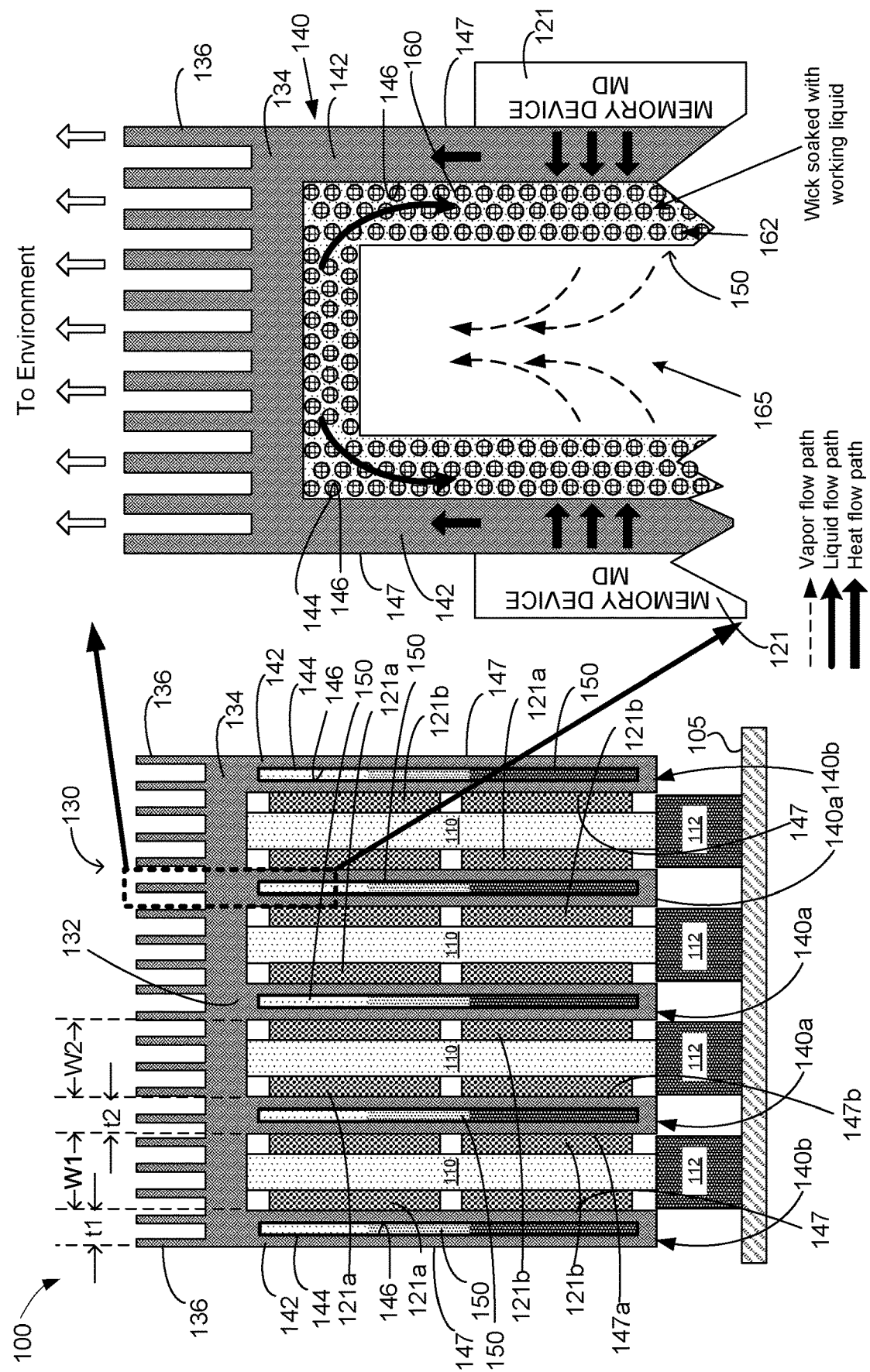
FIGS. 1A, 1B, and 1C illustrate a heat dissipating assembly for memory systems with multiple memory modules in accordance with the present technology.

FIG. 1A illustrates an end cross-sectional view of a memory system 100 including a heat dissipation assembly 130 configured for one or more semiconductor device modules in accordance with the present technology. The memory system 100 includes a computing device 105 (e.g., a motherboard) and memory modules 110 connected to the computing device 105 by memory connectors 112. The memory modules 110 can each include multiple semiconductor memory devices 121 (identified individually as 121a and 121b) on either side thereof, respectively. For example, the memory devices 121 can be memory dies, DRAM, SDRAM, ROM, RAM, power management integrated circuits (PMICs), register clock drivers (RCDs), etc. The heat dissipation assembly 130 is configured to dissipate heat from the memory modules 110. For example, in the embodiment of FIG. 1A, the heat dissipation assembly 130 is attached to the memory modules 110 for dissipating heat from the memory devices 121a,b to maintain the temperature of the memory devices 121a,b within a predetermined operating temperature range.

As discussed above, in conventional memory systems, the gap between the memory devices of adjacent memory modules needs to be more than 2 mm for sufficient air flow to adequately transfer heat from the conventional heat sinks and heat spreaders (e.g., heat pipes, or vacuum chamber heat spreaders). However, in several embodiments, the heat dissipation assembly 130 uses phase transfer technology to efficiently transfer heat generated by the memory devices 121a,b. Thus, several embodiments of the present technology may not need or even desire airflow between adjacent memory modules. Accordingly, the gap between opposing memory devices of adjacent memory modules can be greatly reduced (e.g., 250 microns or less). For example, the gap between opposing memory devices of adjacent memory modules (e.g., between opposing memory devices 121b and 121a of internal memory modules 110) can be in a range of 250 micron to 2 mm in some embodiments, in a range of 250 microns to 1 mm in other embodiments, or 250 microns or less is still other embodiments. Accordingly, the density of the memory modules in a memory system in accordance with the present technology can be greater than in conventional memory systems.

As seen in FIG. 1A, the heat dissipation assembly 130 includes a body 132 having a base 134, cooling features 136 extending from one side of the base 134, and cooling units 140 (identified by reference numbers 140a and 140b) extending from another side of the base 134. The body 132 can be made of a thermally conductive material, such as copper, aluminum, alloys thereof, graphite, thermally-conductive polymers, etc., or any combination thereof. The cooling features 136 can be ridges, grooves, fins and/or other types of indentations and/or protrusions that enhance heat transfer via convection and/or conduction. For example, in the embodiment of FIG. 1A, the cooling features 136 are fins or pillars that project outwardly from the base 134. In FIG. 1A, the fins project from the top surface of the base 134, but the fins and/or other types of cooling features can extend from other portions of the body 132 (e.g., the side surface of the body 132).

The cooling units 140 can include walls 142 that define cavities 144 configured to contain a fluid or other cooling medium. The walls 142 can be made of a thermally conductive material (e.g., copper, aluminum, alloys thereof, graphite, thermally-conductive polymers, etc., or any combination thereof). Each wall 142 can have an interior surface 146 and an exterior surface 147, and the interior surface 146 and the base 134 can define the cavity 144 of each cooling unit 140. The cooling units 140 can be configured to fit in the gap between adjacent memory modules 110 such that the exterior surface 147 on one side of the wall 142 is adjacent at least one of the semiconductor memory devices 121. In some embodiments, the exterior surface 147 of one cooling unit 140 has a first side adjacent a semiconductor memory device 121 of one memory module and a second side adjacent a semiconductor memory device 121 of an adjacent memory module 121.

The heat dissipation assembly 130 can be configured such that the gap between each pair of memory modules 110 is occupied by an individual cooling unit 140. For example, the heat dissipation assembly 130 can have interior cooling units 140a, and the number of interior cooling units 140a is based on the number of pairs of adjacent memory modules having opposing memory devices 121. In the embodiment of FIG. 1A, there are three pairs of adjacent memory modules 110 having opposing memory devices 121, and thus the heat dissipation assembly 130 has at least three interior cooling units 140a (i.e., one cooling unit configured to be positioned between each pair of memory modules 110 having opposing memory devices 121). Other memory systems can have more or less than three pairs of memory modules 110 having opposing memory devices 121. The first side of the exterior surface 147 of an interior cooling unit 140a can be thermally coupled to the memory device 121b on one side of the cooling unit and the second side of the exterior surface 147 can be thermally coupled to the memory device 121a of the adjacent memory module 110 on the opposite side of the cooling unit 140a. For example, in some embodiments, the interior cooling units 140a are configured such that, when the heat dissipation assembly 130 is placed on and/or attached to the memory modules 110, the exterior surfaces 147 of the walls 142 can directly contact the adjacent memory devices 121. In other embodiments, a thermal interface material (TIM) can be between the exterior surfaces 147 of the walls 142 and the adjacent memory devices 121. The interior cooling units 140a are configured to transfer heat to the base 134, which can then be removed via the cooling features 136.

In some embodiments as shown in FIG. 1A, the heat dissipation assembly 130 can include one or more exterior cooling units 140b that extend from the base portion 134 and contact the outer memory devices 121a,b of the outer memory modules 110. The portion of the exterior surface 147 of the exterior cooling units 140b that faces inwardly can directly contact the side surface of the corresponding memory devices 121a,b or be coupled to the memory devices 121*a,b* by a thermal interface material. In some embodiments, one or more of the exterior cooling units 140*b* can be configured to transfer heat from the appropriate memory devices of the memory modules 110 to (a) the surrounding environment via exposed portion of the exterior surfaces 147 and/or (b) the base portion 134.

One or more of the cooling units 140 can include phase transition components 150, which can be substances or separate devices that use phase transition to more efficiently transfer heat from the corresponding memory modules 110 to the body 132. In some embodiments, the phase transition component 150 can be a standalone device that is inserted into the respective cavities 144 of the cooling units 140. In such cases, the cavities 144 can be formed by drilling, forging, etc., and configured to receive the respective phase transition components 150. In some embodiments, a thermal interface material (e.g., thermal contact grease, thermal contact adhesive, etc.) can be disposed between such standalone phase transition components 150 and the interior surface 146 of the cavities 144 to ensure there is good thermal contact. In some embodiments, the phase transition component 150 can be a material matrix or substance contained within the cavities 144. For example, the walls 142 of the compartments 140 can be a material matrix that defines an outer shell of one or more of the phase transition components 150. One or more of the phase transition components 150 can be configured to transfer heat from the cooling units 140 to the base 134 and/or the ambient environment.

FIG. 1B illustrates an expanded view of a portion of an interior cooling unit 140*a* with a corresponding phase transition component 150. The interior cooling unit 140*a* and the phase transition component 150 are between opposing memory devices 121. The horizontal thick solid arrows in FIG. 1B show the heat flow path from the memory devices 121 to the phase transition component 150. Of course, some of the heat can be transmitted to the base portion 134 through the wall 142 as shown by the vertical thick solid arrows in the wall 142.

The phase transition component 150 can include a wicking unit 160 having wicking elements 162 that retain a working fluid. The wicking unit 160 defines a vapor chamber 165 within the cavity 144 of the cooling unit 140. The wicking elements 162 can be, for example, a powder, wire strands, grooves, etc., as appropriate for the type of wicking unit 160. The wicking elements 162, for example, can be copper, aluminum and/or some other appropriate material. The working fluid can be a liquid appropriate for the wicking unit 160 such as, for example, water, ammonia, and/or some other liquid. In operation, the working liquid is retained by the wicking elements 162 via, for example, capillary action. When the working liquid is heated sufficiently, it changes from the liquid phase to the vapor phase, and the vapor rises in the vapor camber 165 (see dotted arrows showing the vapor flow path) to the cooler portion(s) of the phase transition component 150 (e.g., near the base portion 134). Because the base portion 134 is cooler, the heat from the vapor passes to the base portion 134 and then to the environment via convection and/or conduction (see open arrows above cooling features 136). In some embodiments, an external fan (not shown) can force air to flow through the cooling features 136 and/or other hear dissipating components to increase the heat transfer rate. In other embodiments, the heat is transferred through natural convection. Once cooled by the base portion 134, the vapor condenses back into the liquid phase and the working liquid flows down the wicking unit 160 (see thin solid arrows showing the liquid flow path). Thus, heat generated by the opposing memory devices 121 on adjacent memory modules 110 is transferred to the environment and, unlike some systems, no airflow is required between the opposing memory devices of adjacent memory modules. Because airflow between the memory modules is not required to dissipate the heat generated by the memory devices, the memory modules can be arranged in a denser configuration than in conventional memory systems.

Figure 1C:
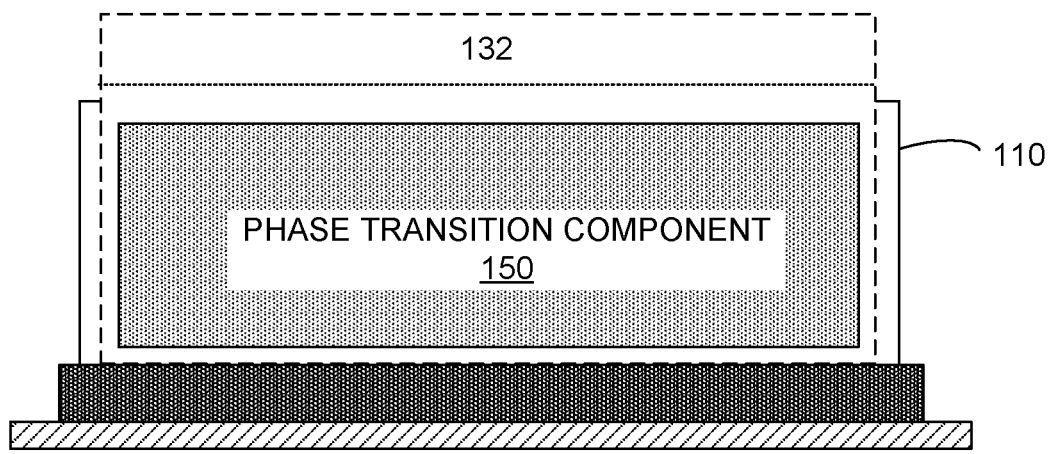

In some embodiments, when the heat dissipation assembly 130 is mounted on the memory system 100, the phase transition component 150 can extend substantially the height of the memory modules 110 (see FIG. 1A) and substantially the length of the memory modules 110. For example, as shown in FIG. 1C, the phase transition component 150 can extend both vertically and horizontally over a side of a memory module (only a dotted outline of the body 132 of heat dissipation assembly 130 is shown in FIG. 1C so that the phase transition component 150 is visible). Alternatively, instead of one phase transition component 150 covering an entire side surface of a memory module 110, multiple phase transition components 150 can be used in each wall 142.

In some embodiments, the exterior cooling units 140*b* can include a phase transition component 150 disposed within the respective cavities 144. The phase transition components 150 can be configured to transfer heat from the interior of the walls 142 to the base portion 134 and/or the exterior side of the cooling units 140*b*. The configuration of the exterior cooling units 140*b* can differ from the interior cooling units 140*a* in that the external side of the exterior cooling units 140*b* can transfer heat to the surrounding environment (e.g., via with the aid of fins and/or other cooling features) because the external side is exposed.

As seen in FIG. 1A, in some embodiments, the spacing W1 between an exterior cooling unit 140*b* and an interior cooling unit 140*a* and/or the spacing W2 between interior cooling units 140*a* in the memory system 100 can be equal to the thickness of a memory module so that the surfaces of the respective walls 142 contact the appropriate memory devices 121. The memory module 110 can be, for example, a standard memory module such as a DDR5 memory module (e.g., about 2.8 mm). In some embodiments, to ensure contact, the position of one or more of the walls 142 can be adjustable and/or the surfaces of the one or more walls 142 can be biased to ensure contact with the side surfaces of the appropriate memory devices 121 (e.g., biased to make contact using springs, screws and/or other types attachment means). The thickness t2 of the interior cooling units 140*a* can be based on the gap size between opposing memory devices of adjacent memory modules. For example, the thickness t2 can be in a range of 250 micron to 2 mm in some embodiments, in a range of 250 microns to 1 mm in other embodiments, or not more than 250 microns in other embodiments. The thickness t1 of the external cooling units 140*b* can equal the thickness t2 in some embodiments. However, because the external side surfaces of the exterior cooling units 140*b* do not contact memory devices 121, the thickness t1 can be greater than t2 or less than t2, as desired.

In the above embodiments, the phase transition component can be a vacuum chamber heat spreader (VCHS) in which the cavity 144 and/or the vacuum chamber 165 are under vacuum. However, other embodiments are not limited to the use of VCHS and other types of phase transition components can be used. For example, a heat pipe can be used in place of or in addition to a VCHS for one or all of the phase transition components 150.

Figure 2B:
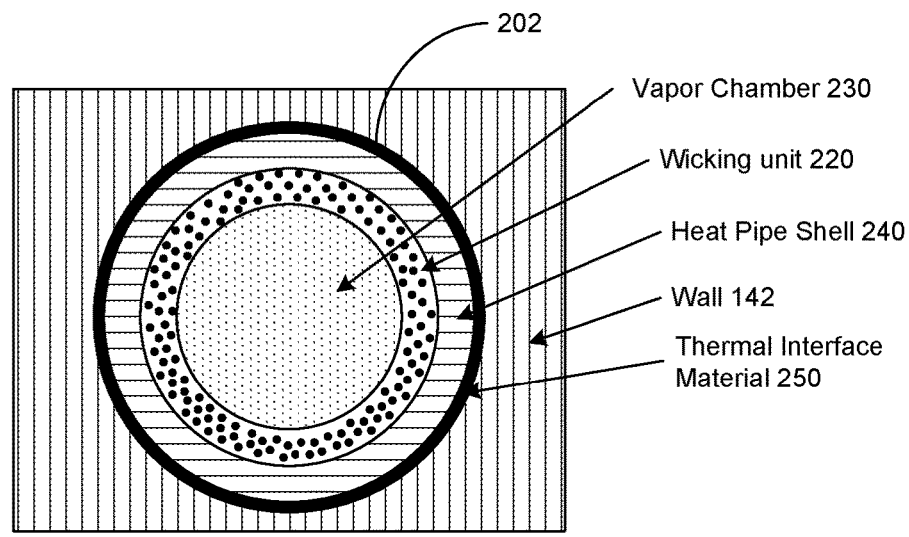
FIGS. 2A and 2B illustrate a heat dissipating assembly for memory systems with multiple memory modules in accordance with the present technology.
Figure 2A:
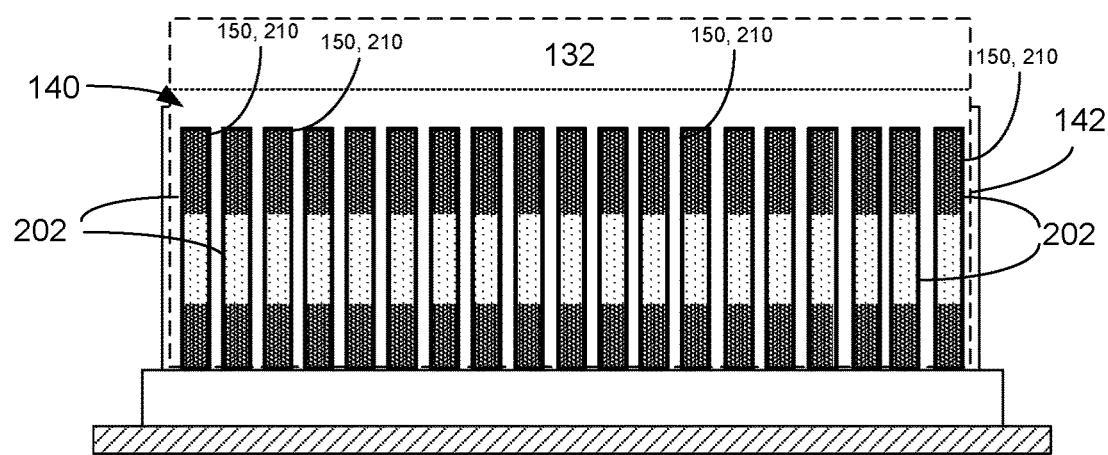

FIG. 2A shows an example in which the cooling unit 140 includes several cavities 202 and a phase transition component 150 in each cavity 202. The phase transition components 150 can be heat pipes 210. As seen in FIG. 2A, the heat pipes 210 can be disposed over one side of the memory module (for clarity only some of the heat pipes are labeled and only the dotted outline of the body 132 is shown in FIG. 2A so that the heat pipes 210 are visible).

FIG. 2B illustrates a top cross-sectional view of an example of a heat pipe 210. Similar to the VCHS described above, the heat pipe 210 includes a wicking unit 220 having wicking elements (e.g., powder, wire strands, grooves, etc., as appropriate for the type of wicking unit) configured to define a vapor chamber 230. The wicking elements can be made of copper, aluminum and/or another appropriate material and a working liquid (e.g., water, ammonia, etc.) can be retained by the wicking elements. The operation of the heat pipe 210 is similar to the VCHS discussed above and thus, for brevity, the operation of the heat pipe 210 will not be discussed in detail. One difference between the VCHS and the heat pipe 210 is that the VCHS transfers the heat in two directions (e.g., horizontal and vertical) while a heat pipe generally transfers the heat in a single direction (e.g., vertical). In the embodiment of FIG. 2B, the heat pipe 210 is a standalone device with a shell 240 encasing the wicking unit 220 and vapor chamber 230. In such cases the wall 142 of the body 132 can have cavities 202 (e.g., drilled holes) configured to receive the heat pipes 210. In some embodiments, a thermal interface material 250 (e.g., thermal contact grease, thermal contact adhesive, etc.) is disposed between the shell 240 and the wall 142 to enhance the thermal conductivity between the components. In some embodiments, the heat pipes 210 and the walls 142 can be assembled separately and joined (e.g., via adhesives, soldering, welding, etc.). In other embodiments, the heat pipes 210 can be integrated with the walls 142. For example, the walls 142 of the body 132 can act as the heat pipe shell.

Figure 3:
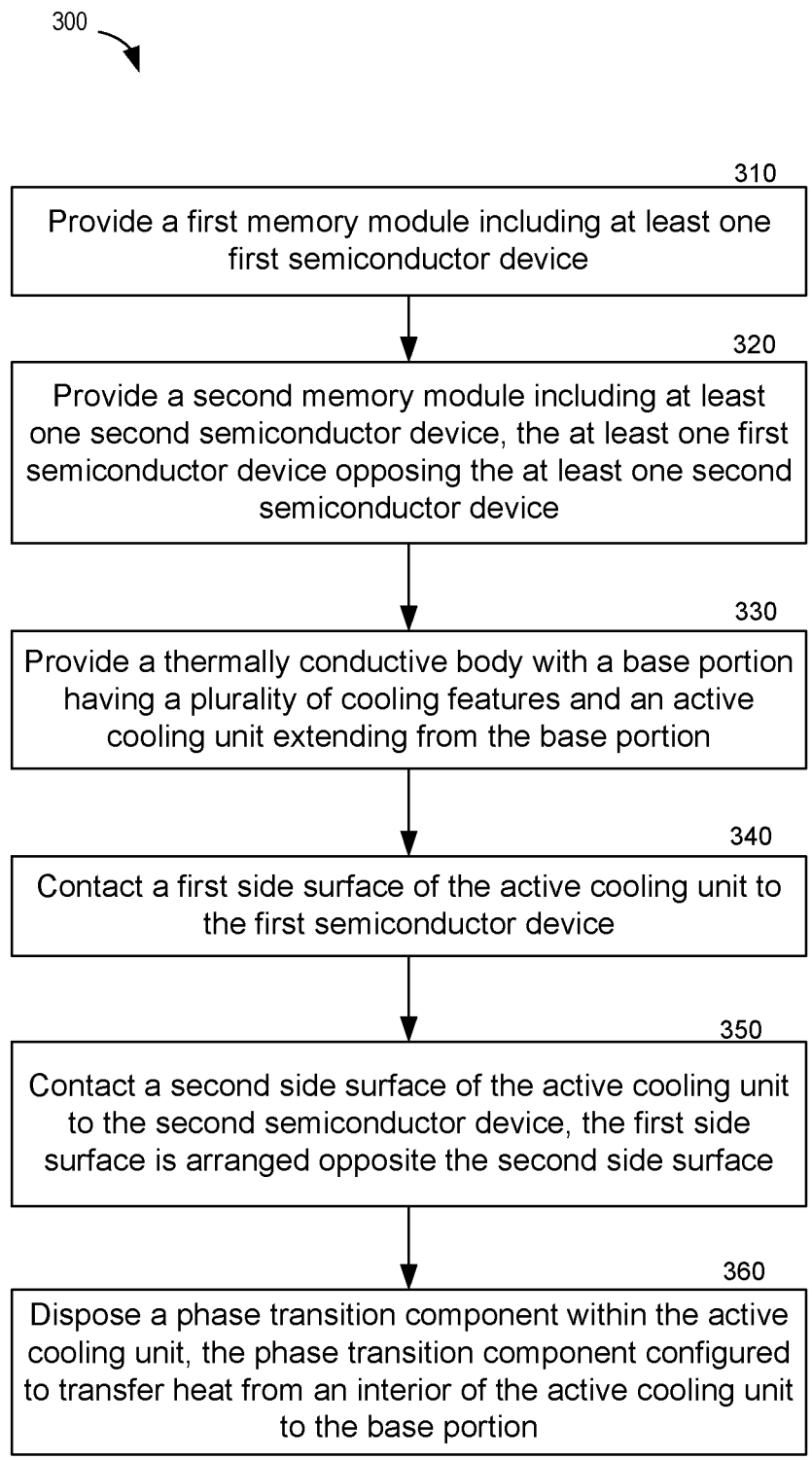
FIG. 3 is a flow chart illustrating a method of configuring a memory system in accordance with the present disclosure.

FIG. 3 is a flow chart illustrating a method 300 of configuring a memory system in accordance with an embodiment of the present disclosure. The method includes providing a first memory module including at least one first semiconductor device (box 310) and providing a second memory module including at least one second semiconductor device such that the first semiconductor device opposes the second semiconductor device (box 320). The method further includes providing a thermally conductive body with a base portion having a plurality of cooling features and a cooling unit extending from the base portion (box 330). The method also includes contacting a first side surface of the cooling unit to the first semiconductor device (box 340) and contacting a second side surface of the cooling unit to the second semiconductor device such that the first side surface is opposite the second side surface (box 350). The method further includes disposing a phase transition component within the cooling unit. The phase transition component is configured to transfer heat from an interior of the cooling unit to the base portion (box 360).

Numerous specific details are discussed to provide a thorough and enabling description of embodiments of the present technology. A person skilled in the art, however, will understand that the technology may have additional embodiments and that the technology may be practiced without several of the details of the embodiments described below with reference to the appended Figures. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the illustrated embodiments, the memory devices and systems are primarily described in the context of DIMMs compatible with DRAM and flash (e.g., NAND and/or NOR) storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, at least some of the heat spreaders described herein may be useful in semiconductor packages other than memory packages.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A heat dissipation assembly, comprising:
a thermally conductive base portion configured to transfer heat away from a plurality of memory devices spaced apart from each other by a gap; and
at least one cooling unit extending from the base portion and having a cavity, the cooling unit configured to fit in the gap between adjacent memory modules such that a first portion of the cooling unit is coupled to a first memory device of the plurality of memory devices and a second portion of cooling unit is coupled to a second memory device of the plurality of memory devices across the gap; and at least one phase transition component in the cavity, the phase transition component defining a chamber and comprising a phase-transition fluid.

2. The assembly of claim 1, wherein the phase transition component further comprises a wicking unit and the chamber is defined by an inner surface of the wicking unit, and wherein the wicking unit is configured to retain the phase-transition fluid via capillary action.

3. The assembly of claim 1, wherein each cavity is enclosed and the phase transition component is configured such that the phase transition fluid vaporizes into the chamber to transfer heat from an interior of the respective cooling unit to the base portion.

4. The assembly of claim 3, wherein each cooling unit includes U-shaped wall that defines the enclosed cavity.

5. The assembly of claim 1, wherein the first portion of the cooling unit is configured to directly contact the first memory device and the second portion of the cooling unit is configured to directly contact the second memory device.

6. The assembly of claim 1, wherein the first portion of the cooling unit is configured to thermally couple to the first memory device by a thermal interface material and the second portion of the cooling unit is configured to thermally couple to the second memory device by a thermal interface material.

7. The assembly of claim 1, wherein the phase transition component comprises a vacuum chamber heat spreader or a heat pipe.

8. The assembly of claim 1, wherein the heat dissipation assembly further includes cooling features extending outwardly from the base portion.

9. The assembly of claim 8, wherein the cooling features comprise ridges, grooves, and/or fins.

10. The assembly of claim 1, further comprising:

an exterior cooling unit extending from the base portion that is configured to contact an outer memory device of an outer memory module of the adjacent memory modules, and wherein the exterior cooling unit includes a second phase transition component configured to transfer heat from an interior of the respective exterior cooling unit to the base portion.

11. The assembly of claim 10, wherein the second phase transition component comprises a vacuum chamber heat spreader or a heat pipe.

12. The assembly of claim 10, wherein the exterior cooling unit is configured to transfer heat from the outer memory device to the surrounding environment via an exposed portion of the exterior cooling unit.

13. The assembly of claim 12, wherein the exposed portion of the exterior cooling unit includes second cooling features extending outwardly from the exposed portion.

14. The assembly of claim 13, wherein the second cooling features are ridges, grooves, and/or fins.

15. The assembly of claim 1, wherein the gap is in a range of 250 microns to 1 mm.

16. The assembly of claim 1, wherein the gap is 250 microns or less.

17. The assembly of claim 1, wherein at least one cooling unit includes a first cooling unit and a second cooling unit, and wherein a spacing between the first cooling unit and the second cooling unit is a thickness of a standard memory module.

18. The assembly of claim 17, wherein the standard memory module is a DDR5 memory module.

19. A heat dissipation assembly, comprising:

a thermally conductive base portion configured to transfer heat away from a first electronic component and a second electronic component spaced apart from each other by a gap; and a cooling unit extending from the base portion and having a cavity, the cooling unit configured to fit in the gap between the first and second electronic components such that a first surface of the cooling unit is thermally coupled to the first electronic component and a second surface of cooling unit is thermally coupled to the second electronic across the gap; and at least one phase transition component in the cavity, the phase transition component defining a chamber and comprising a phase-transition fluid.

20. The assembly of claim 19, wherein the gap is in a range of 250 microns to 1 mm.

* * * * *